United States Patent
Henon et al.

(10) Patent No.: US 11,499,412 B2
(45) Date of Patent: Nov. 15, 2022

(54) METHOD AND DEVICE FOR DETERMINING HYDROCARBON PRODUCTION FOR A RESERVOIR

(71) Applicant: TOTAL SE, Courbevoie (FR)

(72) Inventors: Pascal Henon, Pau (FR); Romain De Loubens, Pau (FR)

(73) Assignee: TOTAL SE, Courbevoie (FR)

( * ) Notice: Subject to any disclaimer, the term of this patent is extended or adjusted under 35 U.S.C. 154(b) by 141 days.

(21) Appl. No.: 16/766,989

(22) PCT Filed: Nov. 24, 2017

(86) PCT No.: PCT/IB2017/001566
§ 371 (c)(1),
(2) Date: May 26, 2020

(87) PCT Pub. No.: WO2019/102244
PCT Pub. Date: May 31, 2019

(65) Prior Publication Data
US 2020/0325765 A1 Oct. 15, 2020

(51) Int. Cl.
*E21B 47/00* (2012.01)
*G06N 20/00* (2019.01)
(Continued)

(52) U.S. Cl.
CPC .............. *E21B 47/00* (2013.01); *E21B 49/00* (2013.01); *G01V 99/005* (2013.01); *G06N 5/04* (2013.01);
(Continued)

(58) Field of Classification Search
CPC ...... E21B 47/00; E21B 49/00; E21B 2200/20; E21B 41/00; E21B 43/00; E21B 43/16; G06N 5/04; G06N 20/00; G06F 17/12
See application file for complete search history.

(56) References Cited

U.S. PATENT DOCUMENTS

2010/0082509 A1 4/2010 Mishev et al.
2010/0082724 A1 4/2010 Diyankov et al.
(Continued)

FOREIGN PATENT DOCUMENTS

WO WO 2016/187175 A1 11/2016

OTHER PUBLICATIONS

J. Frank et al. ("On the construction of deflation-based preconditioners," Siam J. Sci. Comput., v. 23, 442-462, Feb. 2001) (Year: 2001).*

(Continued)

*Primary Examiner* — Daniel R Miller
*Assistant Examiner* — Christian T Bryant
(74) *Attorney, Agent, or Firm* — Patterson Thuente Pedersen, P.A.

(57) ABSTRACT

The present invention relates to a method for determining hydrocarbon production for a reservoir. The method comprises
- determining a projector matrix based on a Jacobian matrix function of the gridded model, then splitting the Jacobian matrix into subsets of consecutive lines.
  - For each subset of consecutive lines, creating a respective square matrix based on said subset.
- A determining eigenvectors and respective eigenvalues associated with the respective square matrix and then determining relevant eigenvectors having respective eigenvalues below a predetermined threshold.
- The projector is determined as a concatenation of the extended eigenvectors ordered according to multiple criteria: the respective order value of the subset; and the respective eigenvalue of the relevant eigenvector.

6 Claims, 10 Drawing Sheets

(51) Int. Cl.

| | | |
|---|---|---|
| *E21B 49/00* | (2006.01) | |
| *G01V 99/00* | (2009.01) | |
| *G06N 5/04* | (2006.01) | |
| *E21B 43/16* | (2006.01) | |
| *E21B 43/00* | (2006.01) | |
| *E21B 41/00* | (2006.01) | |
| *G06F 17/12* | (2006.01) | |

(52) U.S. Cl.
CPC ............. *G06N 20/00* (2019.01); *E21B 41/00* (2013.01); *E21B 43/00* (2013.01); *E21B 43/16* (2013.01); *E21B 2200/20* (2020.05); *G01V 99/00* (2013.01); *G06F 17/12* (2013.01)

(56) References Cited

U.S. PATENT DOCUMENTS

| | | | | |
|---|---|---|---|---|
| 2015/0113379 | A1* | 4/2015 | Wakefield | G06F 30/20 715/227 |
| 2017/0147728 | A1* | 5/2017 | Fung | G06F 17/16 |

OTHER PUBLICATIONS

R. Nabben et al ("A Comparison of deflation and Coarse grid correction applied to porous media flows," Siam H. Numer. Anal., v. 42, 1631-1647, Jan. 2004) (Year: 2004).*

Gergina Pencheva et al: "A Multiscale Mortar Method and Two-Stage Preconditioner for Multiphase Flow Using a Global Jacobian Approach", SPE, Society of Petroleum Engineers, Jan. 1, 2014 (Jan. 1, 2014), pp. 15-17, XP055489596, DOI: 10.2118/172990-MS ISBN: 978-1-61399-361-3 p. 4-p. 5.

H. Cao et al., "Parallel Scalable Unstructured CPR-Type Linear Solver for Reservoir Simulation", SPE 96809, Oct. 9-12, 2005, 8 pages.

Victorita Dolean et al., "An Introduction to Domain Decomposition Methods Algorithms, Theory, and Parallel Implementation" Society for Industrial and Applied Mathematics Philadelphia, 2015, 243 pages.

J.R. Wallis et al., "Constrained Residual Acceleration of Conjugate Residual Methods", SPE 135336, Feb. 10-13, 1985, 14 pages.

Yousef Saad, "Iterative Methods for Sparse Linear Systems", Second Edition, 2003, Society for Industrial and Applied Mathematics, 567 pages.

K. Stuben, "Algebraic Multigrid (AMG): An Introduction with Applications", German National Research Center for Information Technology, St. Augustin, Germany, Nov. 10, 1999, 127 pages.

International Search Report and Written Opinion for PCT/IB2017/001566, dated Jul. 25, 2018, 14 pages.

* cited by examiner

METHOD AND DEVICE FOR DETERMINING HYDROCARBON PRODUCTION FOR A RESERVOIR

The present application is a National Phase entry of PCT Application No. PCT/IB2017/001566, filed Nov. 24, 2017, which application is hereby incorporated by reference herein in its entirety.

FIELD OF THE INVENTION

The present invention relates to the determination of hydrocarbon production in the reservoirs for oil/gas industry.

BACKGROUND OF THE INVENTION

The approaches described in this section could be pursued, but are not necessarily approaches that have been previously conceived or pursued. Therefore, unless otherwise indicated herein, the approaches described in this section are not prior art to the claims in this application and are not admitted to be prior art by inclusion in this section. Furthermore, all embodiments are not necessarily intended to solve all or even any of the problems brought forward in this section.

For the oil/gas company, the determination of the expected production of a reservoir is a key indicator in order to determine where to drill a well and in order to assess the economic value of a reservoir.
In the prior art, dynamic simulator is used to determine the expected production.

From a mathematical point of view, the continuity equation cannot be solved with an analytical solution (in the general case).

Therefore, to solve this problem, numerical solutions are sought, by discretizing the space (gridding) and time (time steps). To determine the numerical solutions, many methods proposed solving the following equation (combination of mass conservation equation and Darcy's Law) for each component:

$$\frac{dM_k}{dt} = -\sum_{i\,in\,neighbouring} F_{ki} - \sum_{w\,in\,well} Q_{k-w}$$

with $dM_k$ the mass accumulated in cell k during the current time step dt for said component
with $F_{ki}$ the net flow rate from cell k into the neighboring cell i during dt
with $Q_{k-w}$ the net flow rate from cell k into well w during dt Although this equation has a linear expression, it is, in fact, non-linear with respect to the physical unknowns (pressure, hydrocarbon component compositions, temperatures . . . ) that are needed to compute the net flow rates. Thus at each time step, one must find the unknown values in cell k so that the non-linear residual $(R_{fl})_k$ is nullified:

$$(R_{fl})_k = \frac{dM_k}{dt} + \sum_{i\,in\,neighbouring} F_{ki} + \sum_{w\,in\,well} Q_{k-w}$$

Figure 1:
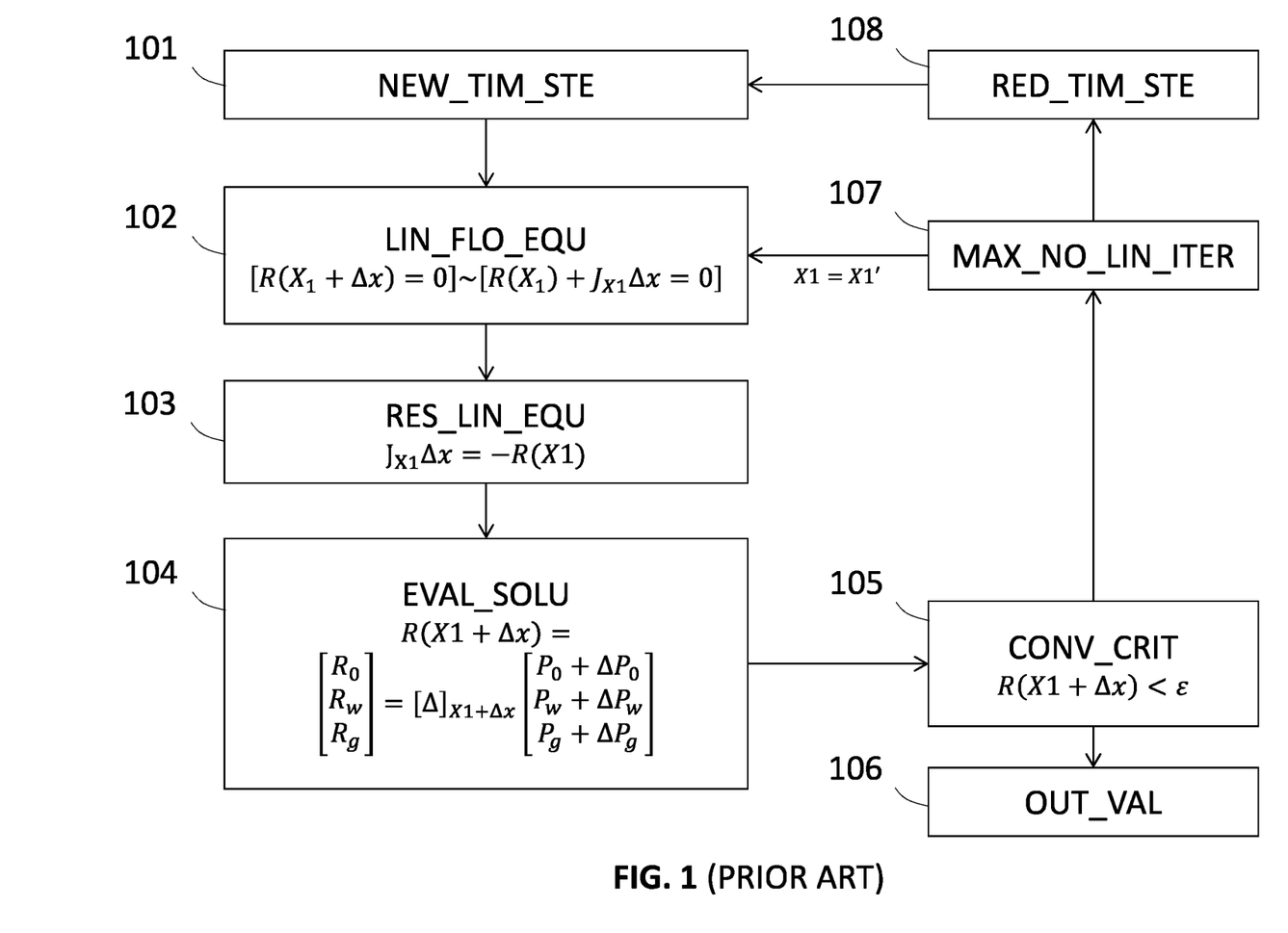
FIG. 1 is a diagram describing a prior art process of solving a flow problem.

The method for the resolution (non-linear Newton iterations) is summarized in FIG. 1.

For a given time step, this time step is considered (step 101).
For the time $t_1$ corresponding to the considered time step, the simulator chooses, a priori, a new solution X1 and starts looking at which correction Δx is needed to get the solution $R(X_1+\Delta x)=0$.

As it is often considered that Δx is small, it is possible to linearize the equation (step 102) into $R(X_1)+J_{X1}\Delta x=0$.
To solve the equation $R(X_1)=J_{X1}\Delta x=0$ (step 103), it is required to invert the Jacobian matrix $J_{X1}: \Delta x = -J_{X1}^{-1} R(X_1)$ Once Δx determined, the non-linear residual $R(X_1+\Delta x)$ is determined (step 104).

If the non-linear residual $R(X_1+\Delta x)$ is lower than a predetermined threshold ε, the time step is considered as solved and X1 is outputted (step 106).

Otherwise, step 102 is reiterated with X1=X1' with X1'=X1+Δx if the maximum number of nonlinear iterations is not reached (test 107, a non-linear iteration being the iteration triggered by test 107: e.g. 103→104→105→107→102→103).

If the maximum number of non-linear iterations is reached, the time step may be reduced (step 108) and the non-linear iteration restarted with the reduced time step (step 101).

Due to this algorithm, it is determined that most of the computation time is spent on the step 103, i.e. inversion of the Jacobian matrix $J_{X1}$.

The Jacobian $J_{X1}$ is a sparse matrix: indeed, each equation of the Jacobian only involves unknowns that are connected by the mesh used for the discretization. The entries of the Jacobian matrix that are related to non-adjacent cells are 0.

In classical reservoir simulation, the solving of equation like Ax=b (where A is a Jacobian matrix, b a vector and x the solution vector to find) uses iterative methods (e.g. GMRES, generalized minimal residual method, Conjugate Gradient, BICGStab see Y. Saad, *Iterative Methods for Sparse Linear Systems* ($2^{nd}$ edition), SIAM, 2003 for details).The iterative methods classically rely on finding an approximation of the solution in a Krylov subspace such that it satisfies a Petrov-Galerkin condition (or variant of Petrov-Galerkin condition see Y. Saad, *Iterative Methods for Sparse Linear Systems* ($2^{nd}$ edition), SIAM, 2003 for more details).

The convergence of said method is function of the ratio between the greatest eigenvalue and the smallest eigenvalue of the matrix A. This ratio is called the condition number of the matrix. The larger is the condition number, the higher will be the number of iterations to solve the linear system Ax=b at a prescribed accuracy.

Instead of solving Ax=b, it is possible to solve:
- $M^{-1}Ax = M^{-1}b$ (left preconditioner providing the same solution)
- $AM^{-1}x' = b$ (right preconditioner, used after a variable change)

The choice of the preconditioner $M^{-1}$ is very important; it must be chosen such that the condition number of the linear operator $M^{-1}A$ (or $AM^{-1}$) is lower than the condition number of A. The ideal choice to lower the condition number is $M^{-1}=A^{-1}$ but of course this has no interest as a preconditioner since the problem is precisely to determine $A^{-1}x$. Thus a good preconditioner is a linear operator such that the condition number of the preconditioned system $M^{-1}Ax=M^{-1}b$ or $AM^{-1}x'=b$ is much lower than the original system Ax=b and such that applying $M^{-1}$ on a vector is much cheaper in number of arithmetic operations than applying directly $A^{-1}$. It is noticeable that a solver can play the role of preconditioner for another solver, this has to be kept in mind to avoid any confusion since many preconditioner technique are also solver on their own (but of course when used as preconditioner the convergence tolerance is looser than when they are used as plain solver). As a direct consequence of the condition number definition, an efficient preconditioner can be constructed from the knowledge of the eigenvectors corresponding to the extremum values of the eigenvalues (for example by ensuring that $M^{-1}Av=v$ for v an eigenvector corresponding to a large or a small eigenvalue of A and $M^{-1}Av=Av$ for the other eigenvalues of A). In practice, computing eigenvectors is usually much more costly in number of arithmetic operations than solving a linear system. Nevertheless, in some problems some inexpensive approximations of the eigenvalues can be computed either by using some physical knowledge of the problem from which the Jacobian system is derived or by exploiting some properties of the matrix A and an efficient preconditioner can be devised from those approximations.

In industrial reservoir simulators, the usual numerical discretization scheme is fully implicit thus each equation of the Jacobian system involves pressure unknowns as well as fluid saturation and concentration unknowns. In a reservoir, the fluid motion is driven by the pressure field, this fact is reflected on the the fact that the conditioning of the Jacobian system is mainly dependent from the conditioning of the pressure subsystem obtained after elimination of the other types of unknowns. The CPR (Constrained Pressure Residual) preconditioning method (see J. R. Wallis, R. P. Kendall T. E. Little, Constrained Residual Acceleration of Conjugate Residual Methods. SPE 13563 presented at the 8th Symposium on Reservoir Simulation, Dallas, Feb. 10-13, 1985 and Cao, H., Tchelepi, H. A., Wallis, J., Yardumian, H.: "Parallel Scalable Unstructured CPR-Type Linear solver for Reservoir simulation", SPE 96809, Proceedings of the SPE Annual Technical Conference, Dallas, Oct. 9-12, 2005 for details) is based on this property: a Jacobian preconditioner is built as a multistep preconditioner which main operation consists in preconditioning an approximation of the reduced pressure linear system. It is noticeable that other numerical schemes such as IMPES (IMplicit Pressure Explicit Saturation) can lead directly to Jacobian system where there are only pressure unknowns in the Jacobian system. The method of preconditioning that we present in this document, is not dependent from the fully implicit numerical scheme nor the CPR method, it applies to any type of numerical scheme discretization used in a reservoir simulation as long as the preconditioner or part of the preconditioner of the Jacobian concerns a pressure unknowns subsystem which matrix is Symmetric Positive Definite (see Y. Saad, *Iterative Methods for Sparse Linear Systems* ($2^{nd}$ *edition*), SIAM, 2003 for mathematical definition of a SPD matrix) or close to a symmetric positive definite matrix (in the sense that $$\frac{\|A - A^t\|}{\|A\|}$$

is small compared to $\|A\|$ and that eigenvectors of $A^tA$ can be considered as good approximations of those of A). Due to the nature of the physical equations governing the fluid flows in porous media at any scale, the method is likely to be applied for any fluid flow simulation in a porous medium: simulation of fluid flows at the scale of a reservoir (several kilometers) or at the scale of a pore network in a rock (up to a few centimeters). As a consequence, in the rest of the document, the linear system considered for the preconditioning method described will not necessarily refer to the full Jacobian system of a reservoir simulator; it can be a system or subsystem resulting from any algebraic transformation of the Jacobian system of a reservoir simulator or system issued from any fluid flow simulator used as a pre or post stage of a reservoir simulator: the typical example being simulations at pore scale of the rocks that are used to numerically determine some rock properties needed in the reservoir simulator (those kind of simulation are usually referred to as Digital Rock Physics simulations)

The only applicability condition for the preconditioning method is that the considered system matrix is SPD or close to a SPD matrix (in the sense described above). There exists a number of methods to determine a proper preconditioner (or optimal preconditioner) on SPD matrix, e.g. Multi-Grid, Algebraic Multi-Grid (AMG), or multi levels Domain Decomposition methods (see V. Dolean, P. Jolivet and F. Nataf, An Introduction to Domain Decomposition Methods: algorithms, theory and parallel implementation SIAM bookstore, 2015 and Stüben K. Algebraic Multigrid (AMG): An Introduction with Applications. Nov. 10, 1999). A preconditioning method is qualified as purely algebraic when it only requires the matrix A of the linear system for the construction of the preconditioner (non purely algebraic method are those that require additional mathematical data such as the mesh geometry, some derivative compute from the continuous equation of the initial problem etc . . . ). The purely algebraic nature of the preconditioner is important in reservoir simulation because the system is not necessarily directly obtained by a discretization of continuous equations: for example this is the case in the fully implicit scheme when one needs to apply a preconditioner for the pressure system produced by the CPR method. Another advantage of a purely algebraic preconditioner is that it is simpler to implement and maintain in a reservoir simulator software. The usual method used to precondition the pressure subsystem in the CPR method is the Algebraic Multi-Grid (see Stüben K. Algebraic Multigrid (AMG): An Introduction with Applications. Nov. 10, 1999), thus the CPR preconditioner is usually called the CPR-AMG method.

The pressure system or subsystem preconditioner is the performance bottleneck in a reservoir simulator running on a massively parallel supercomputer (a computer that connects a very large number of CPU units). The invention presented in this document allows to build a purely algebraic preconditioning method that can replace AMG in the CPR method or be used as part of a preconditioner for a pressure linear system in a reservoir simulator.

We are considering a two-level preconditioner based on a domain decomposition of the set of unknowns. Such type of preconditioner can be written in a general additive form as:

$$M^{-1} = \sum_{\Omega_i} R_i^t A_i^{-1} R_i + Z(Z^t A Z)^{-1} Z^t$$

The matrices $R_i$ correspond to a restriction operator from the global set of unknowns toward the subset of unknowns of the subdomain i ($R_i^t$ corresponds to the prolongation operator). The matrix $A_i$ corresponds to the restriction of the global matrix A to the unknowns of subdomain i (note that $A_i = R_i A R_i^t$).

$\sum_{\Omega_i} R_i^t A_i^{-1} R_i$ can be interpreted as the local solvers in the subdomains and $Z(Z^t A Z)^{-1} Z^t$ can be interpreted as the coarse solver. Note that other variants (such as the multiplicative form) can be written as a two-level preconditioner based on a domain decomposition (see V. Dolean, P. Jolivet and F. Nataf, An Introduction to Domain Decomposition Methods: algorithms, theory and parallel implementation SIAM bookstore, 2015 for a detailed overview of those types of preconditioners).

The main ingredient in a two-level preconditioner as formulated above is the linear operator Z.

Z is classically named a projector: it is difficult to identify a proper projector Z such that the coarse problem solution contains enough information so that the condition number of the preconditioned system can be bounded independently of the number of mesh cells used in the simulation and of the physical heterogeneity (such as rock permeability heterogeneity that influences a lot the condition number of the Jacobian system). In addition, it is important that the determination of the projector Z may be parallelized easily (i.e. that a plurality of processors may compute it without important communications between processors). Finally, in order to obtain a purely algebraic preconditioner, Z needs to be constructed only from the matrix of the linear system (we will also denote this matrix by A in the following).

In the previous system used in reservoir simulation (see AMG method), the determination of the coarsening (i.e. the projector Z) implies many communications between processors in charge of said determination. It is well known that communication between processors in parallelized tasks is a real bottleneck that should be avoided.

Nevertheless, and even if the scientists are well aware of said bottlenecks for linear systems coming from reservoir simulation, no method for the purely algebraic determination of projectors is proposed in which the communication between processors are limited to the maximum or simply avoided.

Thus, there is a need to determine an adequate projector Z in an efficient algebraic way, which can be parallelized.

SUMMARY OF THE INVENTION

The invention relates to a method for determining hydrocarbon production for a reservoir, wherein the method comprises:
modeling the reservoir with a gridded model;
determining a projector matrix based on a Jacobian matrix function of the gridded model, said determining of the projector matrix comprising:
  partitioning the set of unknowns according to a graph partition of the adjacency graph of the Jacobian matrix (using a graph partitioner).
  permuting the Jacobian matrix according to an ordering of the unknowns ensuring that all unknowns related to a same partition are contiguous in the new ordering and ensuring that inside each contiguous set of indices the unknowns connected to unknowns in another set of unknowns are ordered after the unknowns that have no connection outside the set.
  splitting the permuted Jacobian matrix into subsets of consecutive lines, each subset of consecutive lines having a respective order value function of an index of a line in said subset;
  for each subset of consecutive lines:
    creating a respective square matrix based on said subset;
    determining eigenvectors and respective eigenvalues associated with the respective square matrix;
    determining relevant eigenvectors, the relevant eigenvectors being the determined eigenvectors having respective eigenvalues below a predetermined threshold,
  determining the projector as a concatenation of the relevant eigenvectors ordered according to multiple criteria:
    firstly, the respective order value of the subset for which the relevant eigenvector is determined;
    secondly, the respective eigenvalue of the relevant eigenvector;
determining a preconditioner matrix based on the projector;
determining hydrocarbon production for the reservoir based on the preconditioner matrix.

The Jacobian matrix (or a transformation of the Jacobian matrix as in the first stage matrix of the CPR method) may be determined by classical methods such as methods described above (i.e. using non-linear Newton iterations).

"Consecutive lines" of a matrix are lines that have a consecutive index (i.e. line number of the matrix) in said matrix: most of the time the index of a matrix is comprised between 1 (i.e. the first line of the matrix) and the number of lines (i.e. the last line of the matrix).

The order of the subsets may be function of the index of the lines that are in said subset: therefore, the order value of a subset that comprises lines 1-10 may be 1, the order value of a subset that comprises lines 11-15 may be 2, the order value of a subset that comprises lines 16-25 may be 3, etc.

This definition is equivalent to the following: the order of a given subset may be equal or function of the number of subsets having at least one line with a respective index lower than any index of lines that are in said given subset.

By creating a square matrix for each subset (the dimension of the square matrix is equal to the number of lines in the given subset), it is possible to allocate a specific task to a plurality of processors (i.e. determining the eigenvalues and eigenvectors). This task may be performed independently to any other tasks given to other processors. Therefore, the processors do not need to communicate and avoid any bottleneck as described above.

When each processor ends its respective tasks, the projector may be determined by simply extending the eigenvector to the dimension of the global system matrix by adding zeros at indexes of lines not in the subset and then concatenating the extended eigenvectors (horizontal concatenation, i.e. if k vectors should be concatenated, the final matrix has a width of k and a height of the height of the vectors).

The greater the predetermined threshold is, the larger the projector is (as the process will select a great number of eigenvectors as relevant vectors).

In addition, it is also possible that:
a first subset in the subsets of consecutive lines has a line corresponding to a first line of the matrix;
the other subsets in the subsets of consecutive lines have a line immediately subsequent to a line of another subset;
a concatenation of the subsets of consecutive lines being the matrix A ordered such that all unknowns corresponding to a part of the domain partition are subsequent.

Therefore, each line of the matrix A is in a subset, and no line is more than once in a subset.

In addition, it is also possible that:
the respective order value of a subset having a line subsequent to a line of a second subset is greater than the order value of the second subset.

Therefore, the respective order value of the subsets increases while the index of the lines comprised in said subset increases.

The preconditioner operator/matrix is function of $Z$ $(Z^tAZ)^{-1}Z^t$, $Z$ being the determined projector and $A$ being the Jacobian matrix or a matrix built from the Jacobian matrix when the preconditioner is to be used as part of another preconditioner like CPR.

A second aspect relates to a computer program product comprising a computer readable medium, having thereon a computer program comprising program instructions. The computer program is loadable into a data-processing unit and adapted to cause the data-processing unit to carry out the method described above when the computer program is run by the data-processing unit.

A third aspect relates to a device adapted to implement the method described above.

Other features and advantages of the method and apparatus disclosed herein will become apparent from the following description of non-limiting embodiments, with reference to the appended drawings.

BRIEF DESCRIPTION OF THE DRAWINGS

The present invention is illustrated by way of example, and not by way of limitations, in the figures of the accompanying drawings, in which like reference numerals refer to similar elements and in which.

DETAILED DESCRIPTION OF PREFERRED EMBODIMENTS

To explain a possible embodiment for determining a proper projector $Z$ in a parallelized way, FIGS. 2a to 2f provides detailed steps.

For the purpose of simplification, Jacobian $J_{X1}$ or a transformation of the Jacobian matrix (see above) is noted in the following description A.

The purpose of determining the projector $Z$ is to determine a proper preconditioner matrix $M^{-1}$, for instance $M^{-1} = \Sigma_{\Omega_i} R_i^t A_i^{-1} R_i + Z(Z^tAZ)^{-1}Z^t$ and thus to ease the determination of hydrocarbon production in reservoirs for oil/gas industry.

Figure 2A:
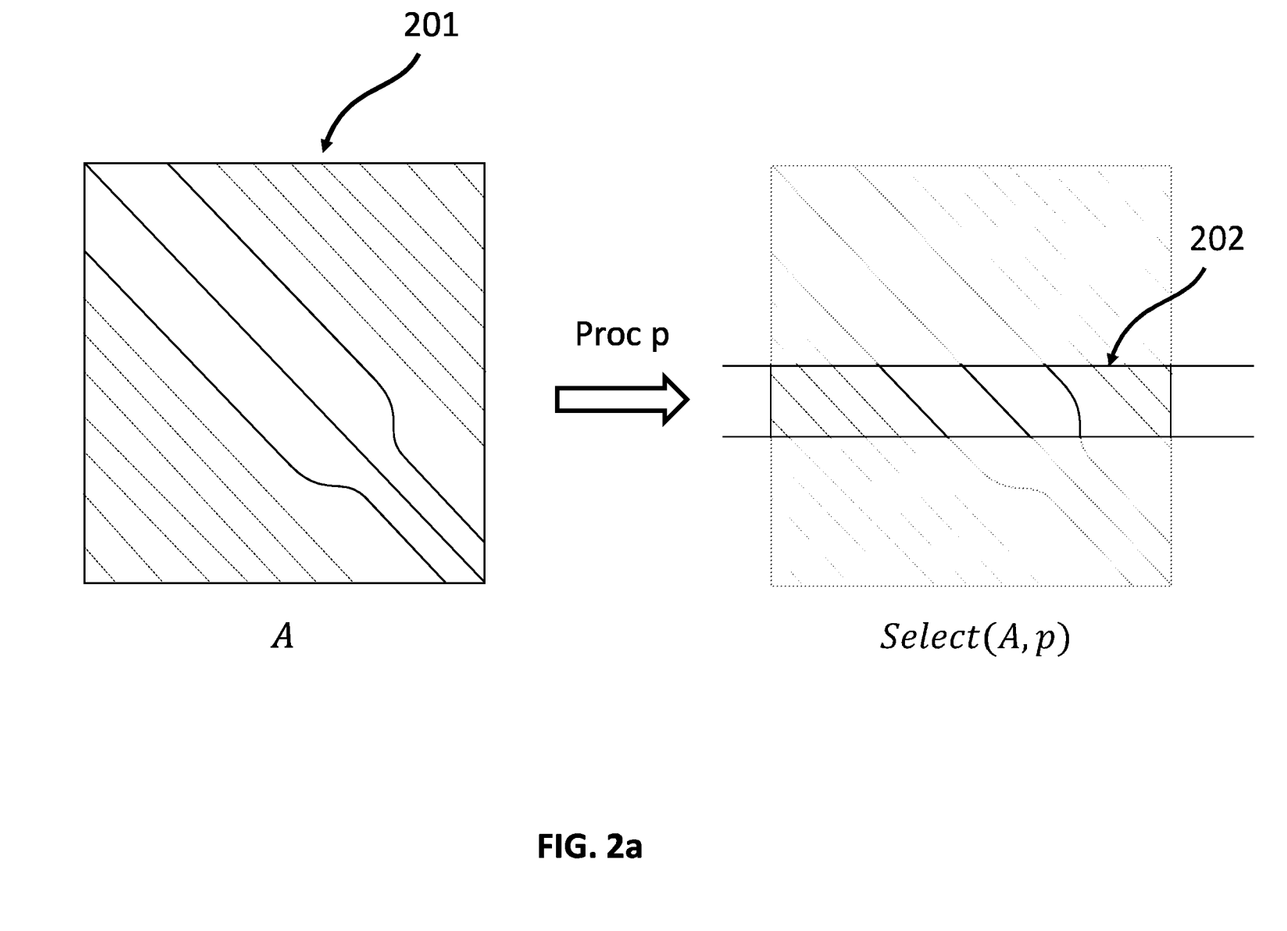
FIG. 2a is a representation of the selection of a matrix for the individual processing by a plurality of processors.

The matrix 201 is an example of A. Said matrix is a sparse matrix n×n, in which many values (blank zones in the representation of matrix 201) are null.

This is mainly due to the fact that the interactions between cells are limited to the neighboring cells.

In order to parallelize the task, a slice of the matrix is determined (202) for each processor p: the first processor receives the first $k_1$ lines (e.g. the order number of said subset comprising the first $k_1$ lines may be 1), the second processor receives the next $k_2$ subsequent lines (e.g. the order number of said subset comprising the next $k_2$ subsequent lines may be 2), the third processor receives the next $k_3$ subsequent lines (e.g. the order number of said subset comprising the next $k_3$ subsequent lines may be 3), etc.

This slicing is a splitting of the Jacobian matrix (201) into subsets of consecutive lines (202).

The number $k_1$, $k_2$, $k_3$, etc. may be identical but it is not mandatory: it is possible to have a different number of lines if the load/capacity/performance/number of available flops/etc. are different for each processor.

Figure 2B:
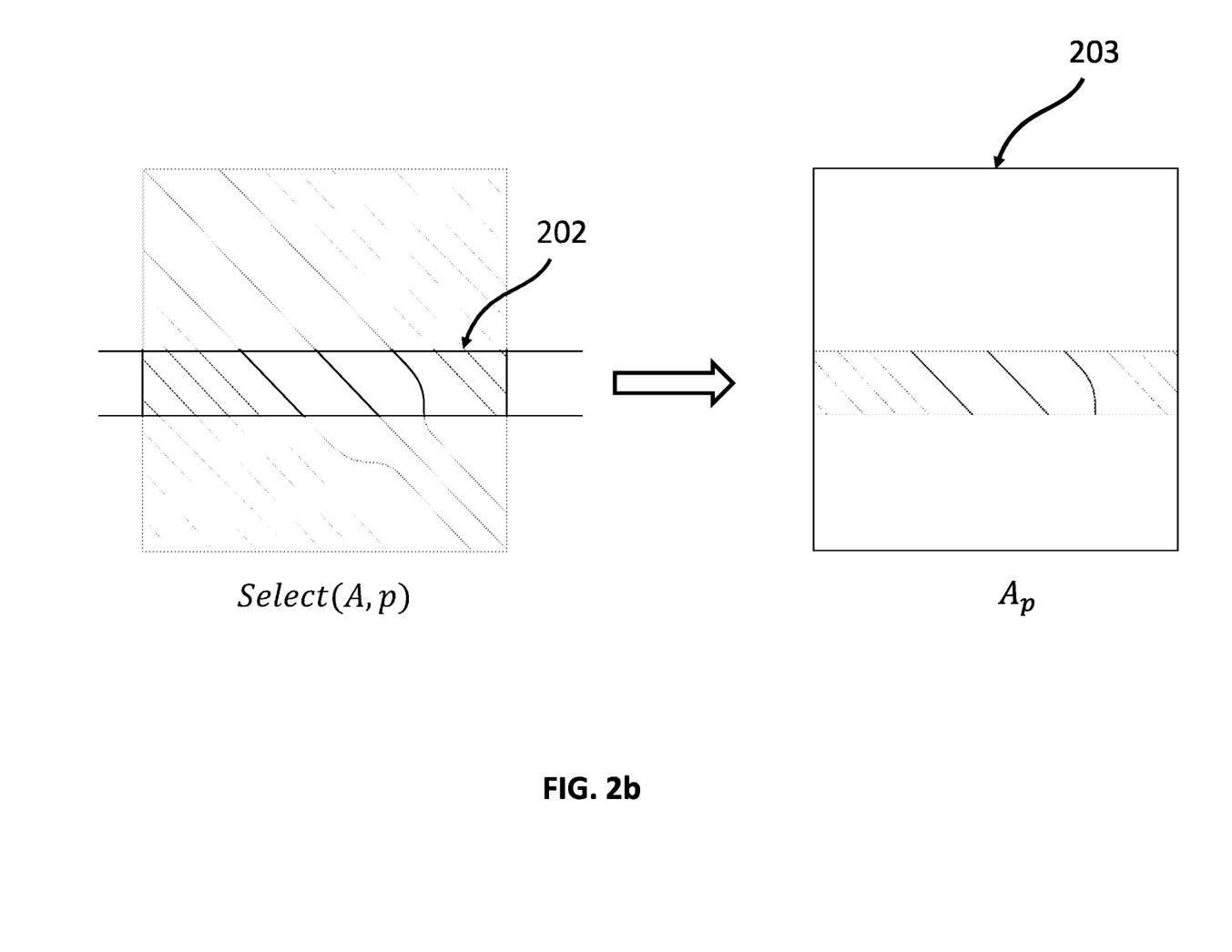
FIG. 2b is a representation of the creation of a square matrix based on the previous selection.

In FIG. 2b, each processor p then determines $A_p$ a square matrix 203 with the received lines (at the same position that in the original matrix), the square matrix may be regarded:
- as the matrix A where the non-received lines are set to zero.
- a null matrix where the received lines are copied at a position identical to their original position in the matrix A
- a matrix where:
  line having index equal to the index of a second line in the received lines is identical to said second line;
  line having no index equal to the index of a second line in the received lines is a line with 0-values.

To detail the eigenvector calculations we need to distinguish the case where the matrix A is symmetric positive definite (SPD) or not.

Figure 2C:
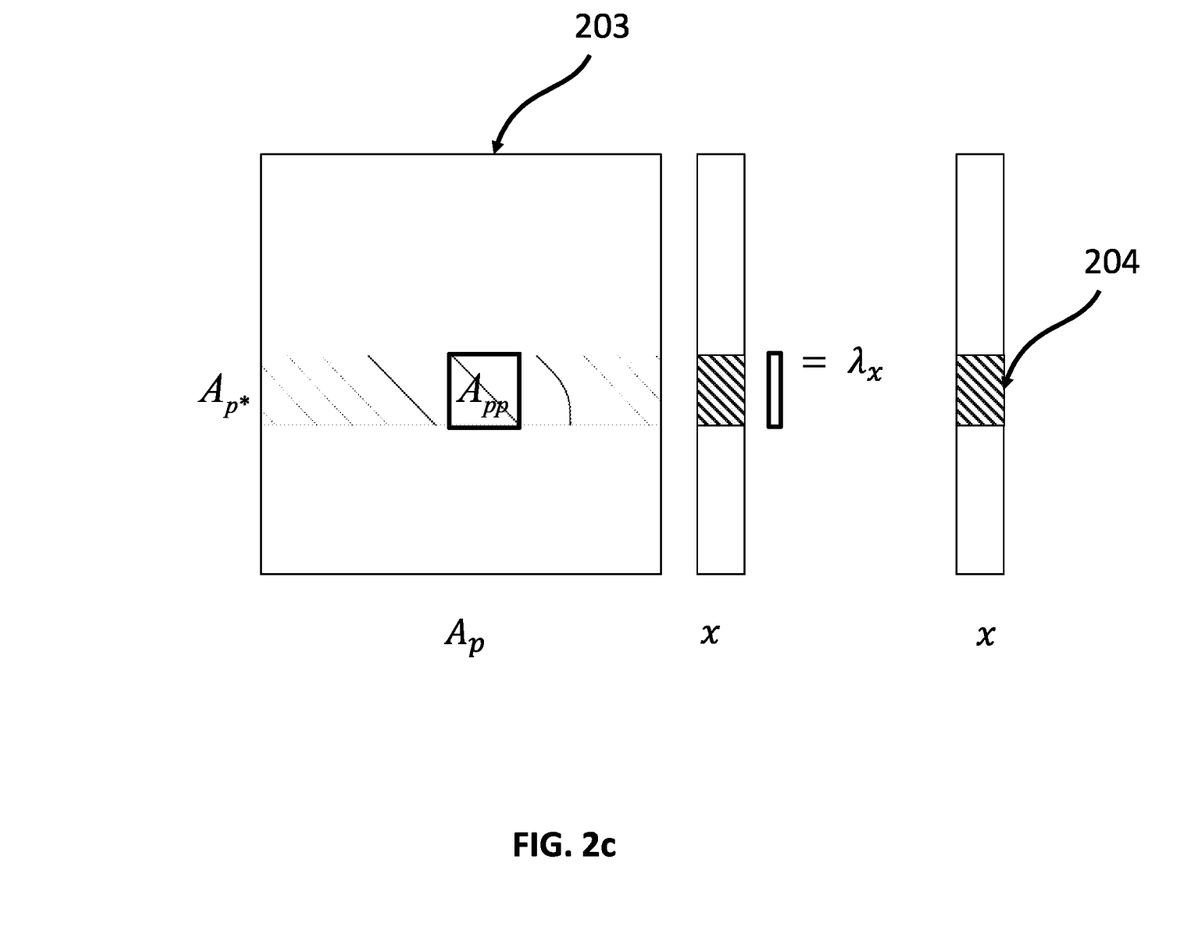
FIG. 2c is a representation of a determination of eigenvalues and eigenvectors for the created square matrix.

Let's first consider the case where the matrix A is a SPD matrix, in this case the computation of the square matrix and the eigenvalues is done as follows (we choose to denote the subset of line $A_p^*$ which is the restriction of the $A_p$ matrix to the received lines as illustrated in FIG. 2c).

we construct the $A_{pp}$ matrix which is a square matrix obtained by considering the restriction of $A_p^*$ to the columns which indexes are in the $p^{th}$ subset of indexes;

we compute the square matrix $B_{pp}$ which is obtained by adding all the entries $A_p^*(i,j)$ that are outside the square matrix $A_{pp}$ in the diagonal coefficient $A_{pp}(i,i)$ of $A_{pp}$ (the indexing $X(i,j)$ refers to a coefficient in the $i^{th}$ line and $j^{th}$ column the considered matrix X);

we compute the eigenvalues $\lambda$ and eigenvectors $v$ of the general eigenvalue problem: $B_p \cdot v = \lambda \cdot A_{pp} \cdot v$ such that $\lambda < \theta$ with $\theta \in [0, 1]$ (it can be proven that all eigenvalues $\lambda$ are in [0, 1]).

In addition, since A is a symmetric positive definite (SPD) matrix then $A_{pp}$ is also SPD.

Thus, we can write the Cholesky decomposition of $A_{pp} = L \cdot L^t$ where L is a lower triangular matrix (see https://en.wikipedia.org/wiki/Cholesky_decomposition) to transform the generalized eigenvalue problem into:

$$B_{pp} v = \lambda L \cdot L^t v$$

Thus it is noticeable that the eigenvectors v can be equivalently computed as $v=(L^t)^{-1}w$ with w being the eigenvector solution to the eigenvalue problem:

$$L^{-1}B_{pp}(L^t)^{-1}w=\lambda w \quad\quad 5$$

The adaptation to non strictly SPD matrix of the projector Z construction relies upon this reformulated eigenvalue problem.

When A is not a symmetric positive definite matrix (which is the case if we want to apply our method as a more parallel replacement for AMG in the CPR-AMG method where the matrix is not perfectly symmetric) we adapt of the method as follows:

instead of computing the Cholesky decomposition, we compute the L.D.U decomposition of the square matrix $A_{pp}$ (as defined in https://en.wikipedia.org/wiki/LU_decomposition. In practice, for reservoir simulation, we assume that this decomposition is always possible without considering a permutation of $A_{pp}$ as in the general formula. But if such a case was encountered a simple line permutation of the $A_p*$ matrix would also allow to write the L.D.U decomposition without having to use a permutation matrix). In this decomposition L is a lower triangular matrix with unitary coefficients on the diagonal, D is a diagonal matrix and U is an upper triangular matrix with unitary coefficients on the diagonal;

we consider the matrix S that is the diagonal matrix obtained from D such that the diagonal coefficient S(i,i) of S are computed as S(i,i)=sqrt(abs(D(i,i))) where S(i,i) and D(i,i) are respectively the coefficient in line i and column i of S and D, abs(x) is the absolute value of x and sqrt(x) is the square root of x.

we compute the square matrix $M_p=S^{-1}L^{-1}B_{pp}U^{-1}S^{-1}$;

we build the square symmetric matrix $K_p=M_p(M_p)^t$-given the chosen threshold θ>0 we select all the eigenvectors w solution of $K_p \cdot w = \lambda w$ such that $\lambda < \theta^2$.

finally we obtain the set of eigenvectors v needed by computing $v=U^{-1}S^{-1} \cdot w$ for any w computed at the previous step.

One can notice that if we apply these more general computations in the case where A is SPD, we end up with the same eigenvectors as with the computations for the previous method dedicated to the purely SPD case (but in a less optimized manner since we do at least some extra computations to obtain $K_p$).

Once the eigenvectors have been computed each vector v is prolongated into a vector x of the same dimension than the A matrix by completing with zero values for the indexes that do not correspond to a received line.

Figure 2D:
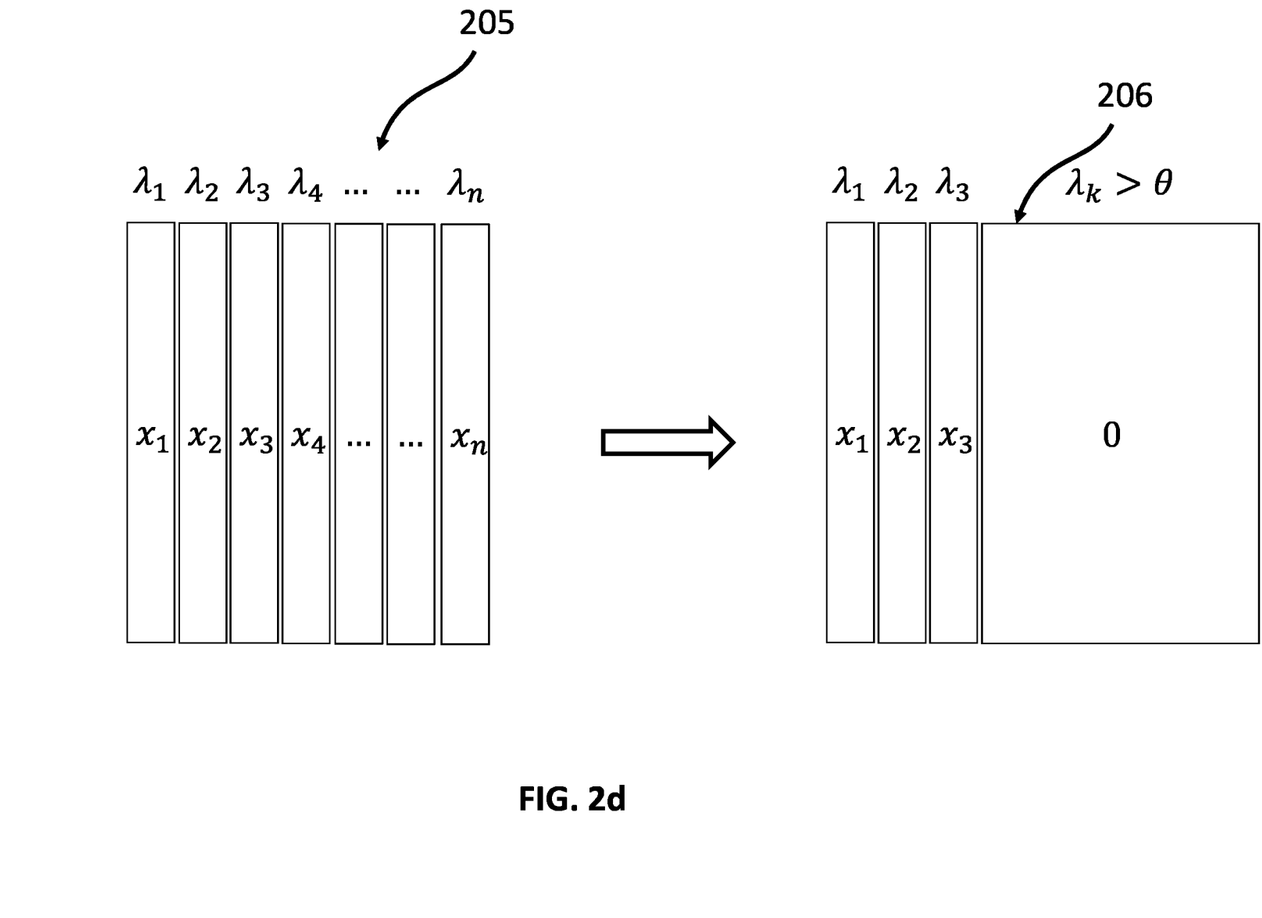
FIG. 2d is a representation of the reduction of the number of eigenvectors based on the associated eigenvalues.

In other words, in the vector x, the values that are not in zone 204 (i.e. zone 204 corresponded to the received lines) may be set to zero. When the n eigenvalues $\{\lambda_k\}_{k\in n}$ and the n eigenvectors $\{x_k\}_{k\in n}$ are determined, it is possible to order (205) the eigenvectors $\{x_k\}_{k\in n}$ according to the order of the corresponding $\lambda_k$ (ascending order). In the example of FIG. 2d, $\lambda_1 \leq \lambda_2 \leq \lambda_3 \leq \ldots \lambda_n$.

Figure 2E:
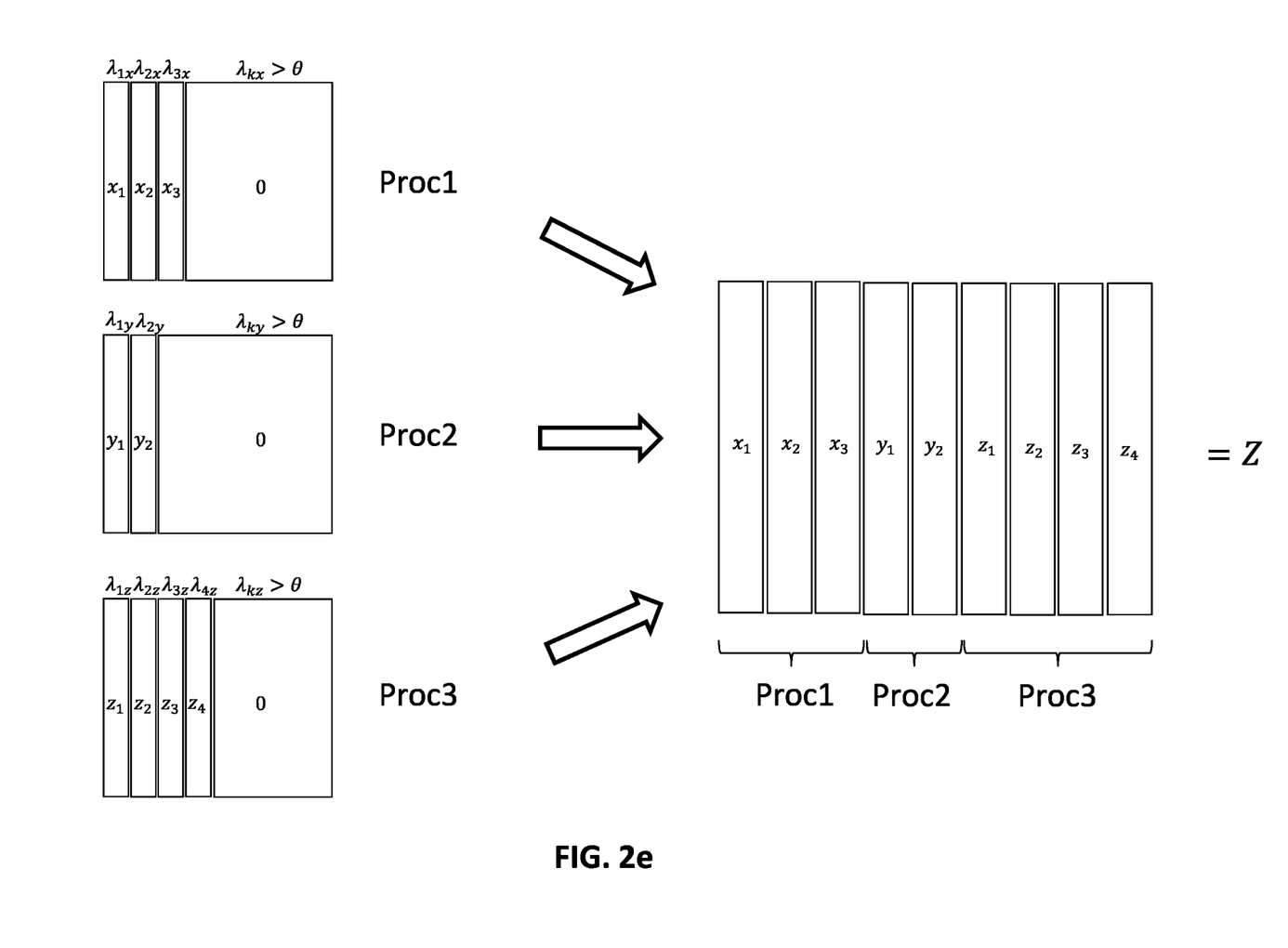
FIG. 2e is a representation of a determination of the projector $Z$ based on the determined eigenvectors for all processors.

Then, all the non-identified eigenvectors, for each processor having received lines from the A matrix, may be concatenated, in the order of the sequence of lines (i.e. order value of the subset of lines) that has been received by the processor:

if the processor Proc1 has received the first lines, the identified eigenvectors for said processor is retrieved and forms the first columns of a new matrix Z (in the example of FIG. 2e, three eigenvectors have been identified for Proc1, said processor Proc1 having received the first lines of the matrix A).

if the processor Proc2 has received a number of immediate subsequent lines (i.e. after the lines of Proc1), the identified eigenvectors for said processor is retrieved and forms the immediate subsequent columns of the new matrix Z (in the example of FIG. 2e, two eigenvectors have been identified for Proc2, said processor Proc2 having received the immediate subsequent lines of the matrix A, after the lines of Proc1).

if the processor Proc3 has received a number of immediate subsequent lines (i.e. after the lines of Proc2), the identified eigenvectors for said processor is retrieved and forms the immediate subsequent columns of the new matrix Z (in the example of FIG. 2e, four eigenvectors have been identified for Proc3, said processor Proc3 having received the immediate subsequent lines of the matrix A, after the lines of Proc2).

This is equivalent to determining eigenvectors having respective eigenvalues below a predetermined threshold (θ) as relevant eigenvectors and concatenating said relevant eigenvectors according:

firstly, the respective order value of the subset for which the relevant eigenvector is determined;

secondly, the respective eigenvalue of the relevant eigenvector.

It is noted that there are two criteria for the ordering: it means that, first, the groups of eigenvectors (i.e. one group per processor) are ordered according respective order value of the subset for which the relevant eigenvectors are determined, and then each group of eigenvectors are ordered according to the respective eigenvalue.

Figure 2F:
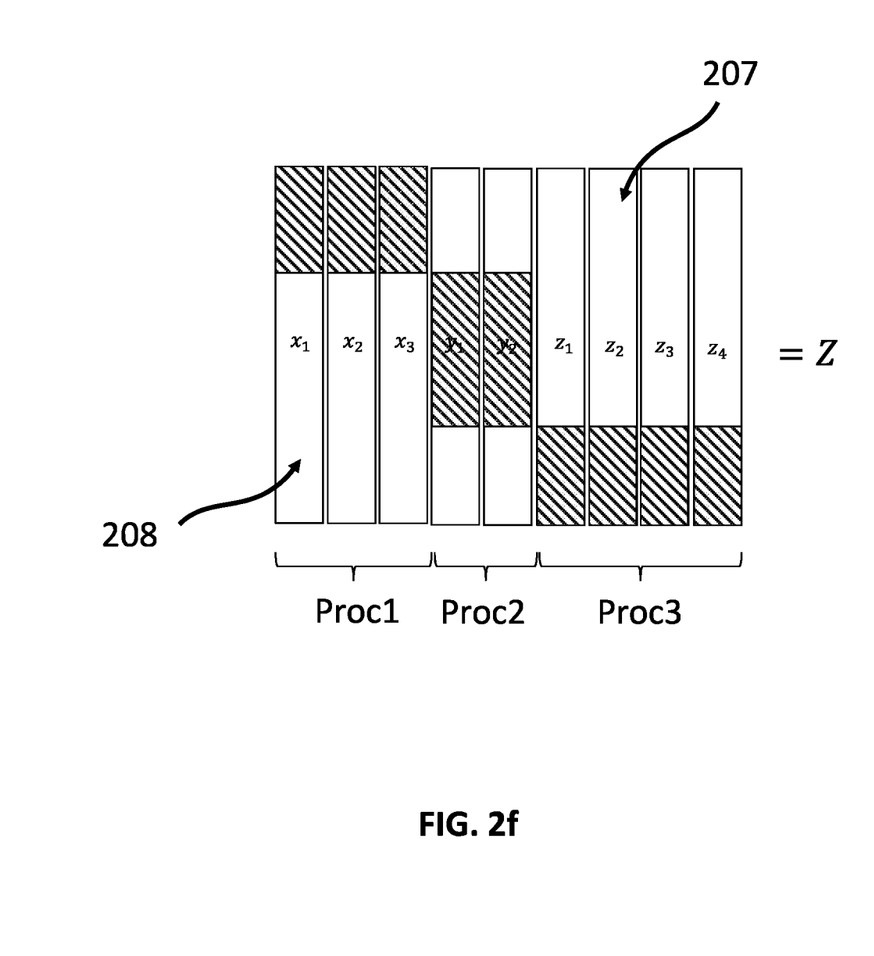
FIG. 2f is a representation of the projector $Z$ obtained after concatenation of the extended eigenvector obtained in each subset of the global matrix. For each extended eigenvector the dash part corresponds to a eigenvector of a square matrix and the remaining corresponds to the zeros added to obtain a vector of the dimension of the global matrix $A$.

As noted in FIG. 2c, the eigenvectors have null values in zones that do not correspond to the received lines. Therefore, and as shown in FIG. 2f, the Z matrix is formed of diagonal blocks, outside said block the value of Z is zero (see zones 207 and 208). The Z matrix has a height of n, the width of matrix Z is m, m being lesser or equal to n (depending of the value of the threshold θ: the lesser θ is, the lesser m is).

Figure 3:
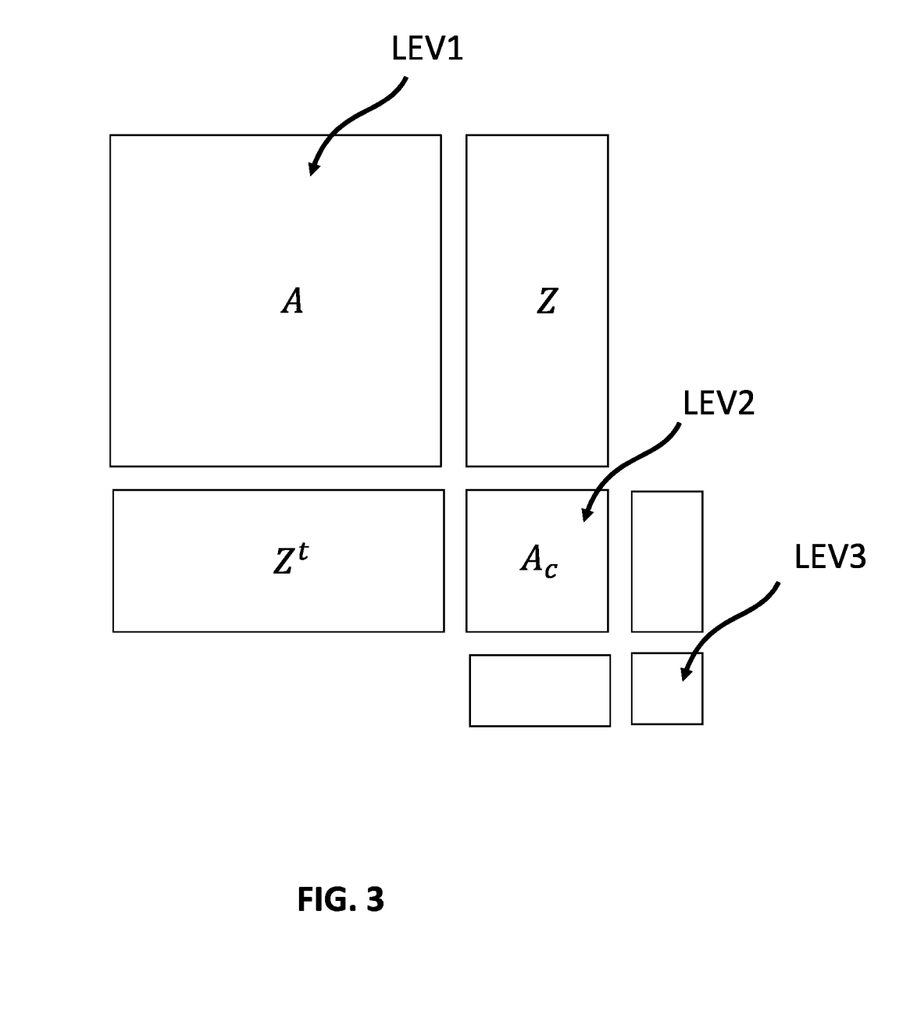
FIG. 3 is a representation of multilevel approach for the projector $Z$.

Said Z matrix allows projecting the matrix A (LEV1) on a coarser grid, $Z^t A Z = A_c$ (see LEV2, FIG. 3). If the same process of determining a projector is reapplied to $A_c$, it is possible to determine a coarser level LEV3.

Thanks to this approach, it is possible to have a multilevel approach: if the matrix $A_c$ is too big, the process of determination of the projector Z may be recursively applied on $A_c$ until the size of $A_c$ is correct (i.e. adequate for the use of the users computing said matrix).

In order to determine the preconditioner M, the following formula is used:

$$M^{-1} = \sum_{\Omega_i} R_i^t A_i^{-1} R_i + Z(Z^t A Z)^{-1} Z^t$$

with $\{\Omega_i\}_i$ a set of local domain/space.

It is noted that other formula may exist: the core of the invention is to provide coarsening method and thus the computation of Z.

Figure 4:
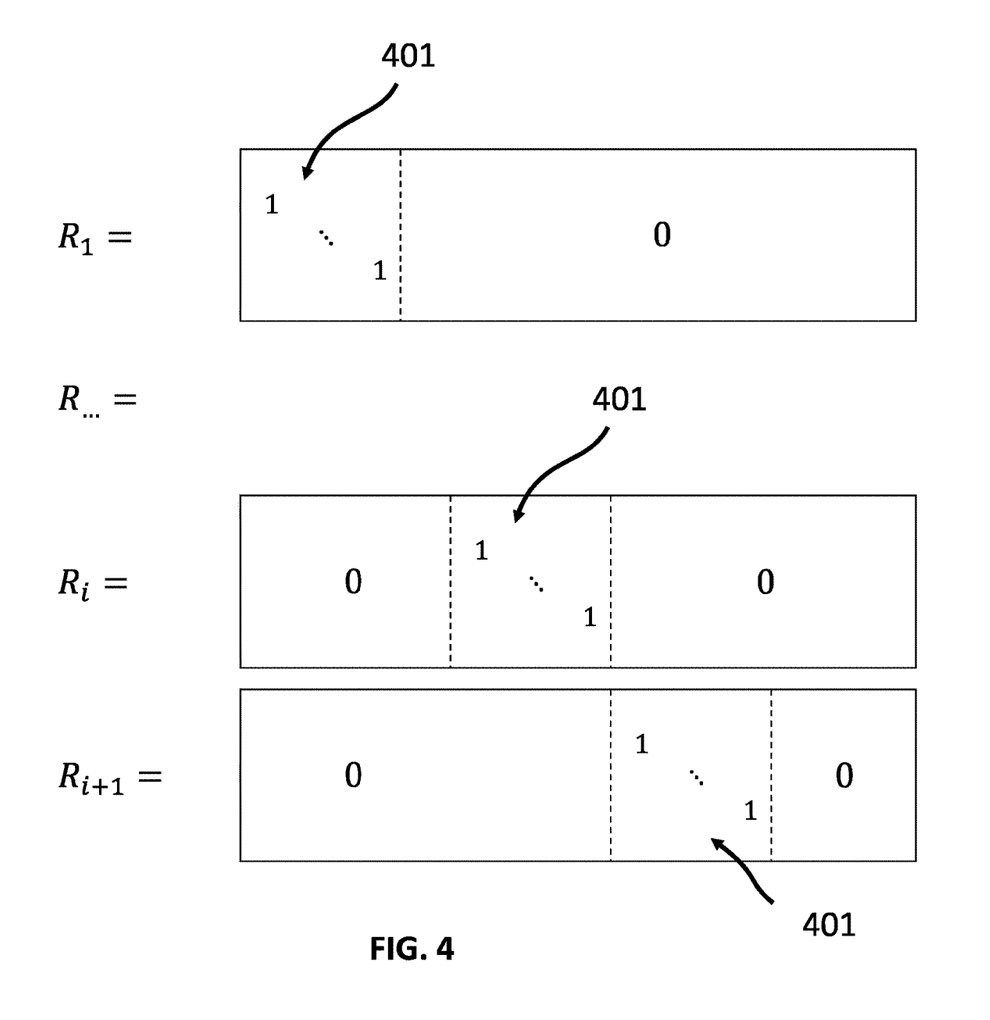
FIG. 4 is a representation of the determination of $R_i$ for the determination of the local solvers (part of the preconditioner)

For each space $\Omega_i$, it is defined matrix $R_i$. $R_i$ being a matrix has shown in FIG. 4:

$R_i$ is a matrix with n column (width) and j lines (height);

$R_i$ has a j×j block being an identity block 401 (1 for the diagonal, 0 for the other values), the other values of the matrix $R_i$ (except the identity block 401) being 0.

The identity block 401 for $R_1$ corresponds to columns 1 (i.e. the first) to j of the matrix $R_1$, the identity block 401 for $R_2$ corresponds to columns j+1 to 2j of the matrix $R_2$, ..., the identity block 401 for $R_k$ corresponds to columns (k−1)j+1 to kj of the matrix $R_2$, etc.

In addition, the matrix $A_i$ is defined as $A_i = (R_i A R_i^t)$.

These choices are adapted to the reservoir flow determination, digital rock physics, PNM (Pore Network model), etc. and to any fluid flow in porous media.

Figure 5:
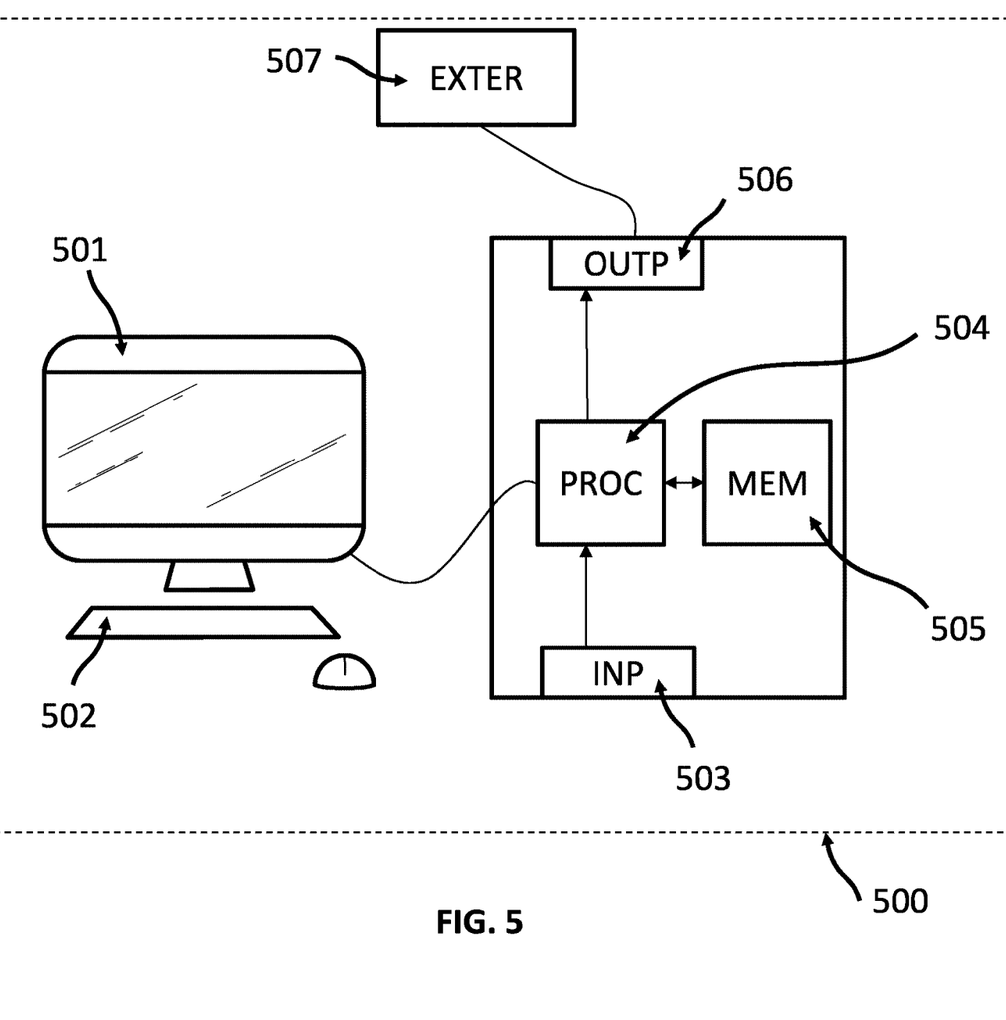
FIG. 5 is a possible embodiment for a device that enables the present invention.

Part of the steps described above can represent steps of an example of a computer program which may be executed by the device of FIG. 5.

FIG. 5 is a possible embodiment for a device that enables the present invention.

In this embodiment, the device 500 comprise a computer, this computer comprising a memory 505 to store program instructions loadable into a circuit and adapted to cause circuit 504 to carry out the steps of the present invention when the program instructions are run by the circuit 504.

The memory 505 may also store data and useful information for carrying the steps of the present invention as described above.

The circuit 504 may be for instance:
- a processor or a processing unit adapted to interpret instructions in a computer language, the processor or the processing unit may comprise, may be associated with or be attached to a memory comprising the instructions, or
- the association of a processor/processing unit and a memory, the processor or the processing unit adapted to interpret instructions in a computer language, the memory comprising said instructions, or
- an electronic card wherein the steps of the invention are described within silicon, or
- a programmable electronic chip such as a FPGA chip (for «Field-Programmable Gate Array»).

This computer comprises an input interface 503 for the reception of data used for the above method (e.g. the reservoir model) according to the invention and an output interface 506 for providing the projector Z or the preconditioner M to an external device 507.

To ease the interaction with the computer, a screen 501 and a keyboard 502 may be provided and connected to the computer circuit 504.

Expressions such as "comprise", "include", "incorporate", "contain", "is" and "have" are to be construed in a non-exclusive manner when interpreting the description and its associated claims, namely construed to allow for other items or components which are not explicitly defined also to be present. Reference to the singular is also to be construed in be a reference to the plural and vice versa.

A person skilled in the art will readily appreciate that various parameters disclosed in the description may be modified and that various embodiments disclosed may be combined without departing from the scope of the invention.

It is noted that the previous examples are 2D examples for the sake of simplicity, but 3D examples may be derived from these 2D\examples without difficulties.

The invention claimed is:

1. A method for determining hydrocarbon production for a reservoir, wherein the method comprises:

modeling the reservoir with a gridded model, said model having partitions represented by a Jacobian matrix function of unknowns for computing a flow rate, the unknowns comprising: a pressure, hydrocarbon component compositions, and a temperature;

permuting the Jacobian matrix function of the gridded model according to an ordering of the unknowns to obtain a first matrix the unknowns each having a respective index in said permutation, the permutation is performed so that a set of all unknowns related to a same partition in the partitions have a contiguous set of indexes in the ordering and so that inside each contiguous set of indexes the unknowns of the set of unknowns that are connected to unknowns in another set of unknowns have indexes greater than the indexes of unknowns that have no connection outside the set of unknowns;

determining a projector matrix function of the first matrix, said determining of the projector matrix comprising:

splitting the first matrix into subsets of consecutive lines, each subset of consecutive lines having a respective order value function of an index of a line in said subset;

for each subset of consecutive lines:

creating a respective square matrix based on said subset;

determining extended eigenvectors and respective eigenvalues associated with the eigenvalues of the respective square matrix;

determining relevant eigenvectors, the relevant eigenvector being the determined eigenvectors having respective eigenvalues below a predetermined threshold, determining the projector matrixes a concatenation of the relevant eigenvectors ordered according to multiple criteria as follows:

firstly, the respective order value of the subset for which the relevant eigenvector is determined;

secondly, the respective eigenvalue of the relevant eigenvector;

determining a preconditioner operator based on the projector matrix, wherein the preconditioner operator is a function of $Z(Z^t A Z)^{-1} Z^t$, Z being the determined projector matrix and A being the Jacobian matrix or a matrix obtained after a transformation of the Jacobian matrix; and determining hydrocarbon production for the reservoir based on the preconditioner operator.

2. The method according to claim 1, wherein a first subset in the subsets of consecutive lines has a line corresponding to a first line of the matrix;

the other subset in the subsets of consecutive lines has a line immediately subsequent to a line of another subset;

a concatenation of the subsets of consecutive lines being the Jacobian matrix.

3. The method according to claim 1, wherein:

the respective order value of a subset having a line subsequent to a line of a second subset is greater that the order value of the second subset.

4. The method according to claim 1, wherein:

line of the respective square matrix having index equal to the index of a second line in the subset of consecutive lines is identical to said second line;

line of the respective square matrix having no index equal to the index of a second line in the subset of consecutive lines is a line with 0-values.

5. A non-transitory computer readable storage medium, having stored thereon a computer program comprising program instructions, the computer program being loadable into a data-processing unit and adapted to cause the data-processing unit to carry out the steps of any of claim 1 when the computer program is run by the data-processing device.

6. A device for determining hydrocarbon production for a reservoir, wherein the device comprises an interface to receive information of the reservoir:
  wherein the device comprises a processor adapted to:
    model the reservoir with a gridded model based on the received information of the reservoir said model having partitions represented by a Jacobian matrix function of unknowns for computing a flow rate, the unknowns comprising: a pressure, a hydrocarbon component compositions, and a temperature;
    permuting the Jacobian matrix function of the e gridded model according to an ordering of the unknowns to obtain a first matrix, the unknowns each having a respective index in said permutation, the permutation is performed so that a set of all unknowns related to a same partition in the partitions have a contiguous set of indexes in the ordering and so that inside each contiguous set of indexes the unknowns of the set of unknowns that are connected to unknowns in another set of unknowns have indexes greater than the indexes of unknowns that have no connection outside the set of unknowns;
    determine a projector matrix function of the first matrix, said determining of the projector matrix comprising:
      splitting the Jacobian matrix into subsets of consecutive lines, each subset of consecutive lines having a respective order value function of an index of a line in said subset;
      for each subset of consecutive lines:
        creating a respective square matrix based on said subset;
      determining eigenvectors and respective eigen values associated with the respective square matrix;
      determining relevant eigenvectors, the relevant eigenvector being the determined eigenvectors having respective eigen values below a predetermined threshold,
      extending the relevant eigenvectors by adding zero values to the indexes corresponding to line outside the slice;
    determining the projector matrix as a concatenation of the extended eigenvectors ordered according to a multiple criteria as follows:
      firstly, the respective order value of the subset for which the relevant eigenvector is determined;
      secondly, the respective eigenvalue of the relevant eigenvector;
  determine a preconditioner operator based on the projector matrix, wherein the preconditioner operator is a function of $Z(Z^t A Z)^{-1} Z^t$, Z being the determined projector matrix and A being the Jacobian matrix or a matrix obtained after a transformation of the Jacobian matrix; and
  determine hydrocarbon production for the reservoir based on the preconditioner operator.

* * * * *

UNITED STATES PATENT AND TRADEMARK OFFICE
CERTIFICATE OF CORRECTION

PATENT NO. : 11,499,412 B2
APPLICATION NO. : 16/766989
DATED : November 15, 2022
INVENTOR(S) : Henon et al.

Page 1 of 1

It is certified that error appears in the above-identified patent and that said Letters Patent is hereby corrected as shown below:

In the Claims

Column 11, Line 66:
Delete "hydrocarbon", and insert --a hydrocarbon--.

Column 12, Line 3:
Delete "matrix", and insert --matrix,--.

Column 12, Line 29:
Delete "matrixes", and insert --matrix as a--.

Column 12, Line 53:
Delete "that", and insert --than--.

Column 13, Line 11:
Delete "e gridded", and insert --gridded--.

Column 14, Lines 4-5:
Delete "eigen values", and insert --eigenvalues--.

Column 14, Line 8:
Delete "eigen values", and insert --eigenvalues--.

Signed and Sealed this
Ninth Day of May, 2023

Katherine Kelly Vidal
*Director of the United States Patent and Trademark Office*